(12) United States Patent
Lachartre

(10) Patent No.: US 8,179,945 B2
(45) Date of Patent: May 15, 2012

(54) RADIO TRANSMITTER DEVICE

(75) Inventor: David Lachartre, Montbonnot (FR)

(73) Assignee: Commissariat a l'Energie Atomique, Paris la Defense Cedex (FR)

( * ) Notice: Subject to any disclaimer, the term of this patent is extended or adjusted under 35 U.S.C. 154(b) by 358 days.

(21) Appl. No.: 12/527,556

(22) PCT Filed: Feb. 19, 2008

(86) PCT No.: PCT/EP2008/052006
§ 371 (c)(1),
(2), (4) Date: Aug. 17, 2009

(87) PCT Pub. No.: WO2008/101927
PCT Pub. Date: Aug. 28, 2008

(65) Prior Publication Data
US 2010/0008399 A1    Jan. 14, 2010

(30) Foreign Application Priority Data
Feb. 20, 2007  (FR) ...................................... 07 53371

(51) Int. Cl.
*H04B 1/69* (2011.01)
*H04B 1/707* (2011.01)
*H04B 1/713* (2011.01)
(52) U.S. Cl. ........ 375/130; 375/300; 375/259; 327/105; 327/106; 327/107; 370/270; 370/272
(58) Field of Classification Search .................. 375/130, 375/300, 259; 327/105, 106, 107; 708/270, 708/272
See application file for complete search history.

(56) References Cited

U.S. PATENT DOCUMENTS

| 4,127,034 A | * | 11/1978 | Lederman et al. | ............... 73/626 |
| 4,625,177 A | * | 11/1986 | Conway et al. | ............... 327/105 |
| 5,263,483 A | * | 11/1993 | Nishigaki et al. | ............. 600/437 |
| 6,122,223 A | * | 9/2000 | Hossack | ......................... 367/11 |

(Continued)

FOREIGN PATENT DOCUMENTS
EP    1376149 A1    1/2004
(Continued)

OTHER PUBLICATIONS

Kim, H. et al., "All Digital Low-Power CMOS Pulse Generator for UWB System", Electronics Letters, vol. 40, No. 24, 2 pages (Nov. 25, 2004).

(Continued)

*Primary Examiner* — Phuong Phu
(74) *Attorney, Agent, or Firm* — Nixon Peabody LLP

(57) ABSTRACT

Transmitter device which includes at least: a) one delay line designed to output M signals which are delayed in relation to each other, where M is an integer greater than 1; b) a memory, designed to store at least M digital samples of a waveform, where each digital sample contains N bits, and to output each of the M digital samples successively on N output lines respectively under the control of one of the M delayed signals; and c) a digital-analog converter which includes N inputs linked to N output lines, designed to convert the M digital samples received as input from the N output lines of the memory and to successively output, on an output of the digital-analog converter, each of the M analog converted digital samples which together form an analog signal which is representative of the waveform.

43 Claims, 9 Drawing Sheets

U.S. PATENT DOCUMENTS

Figure 1:
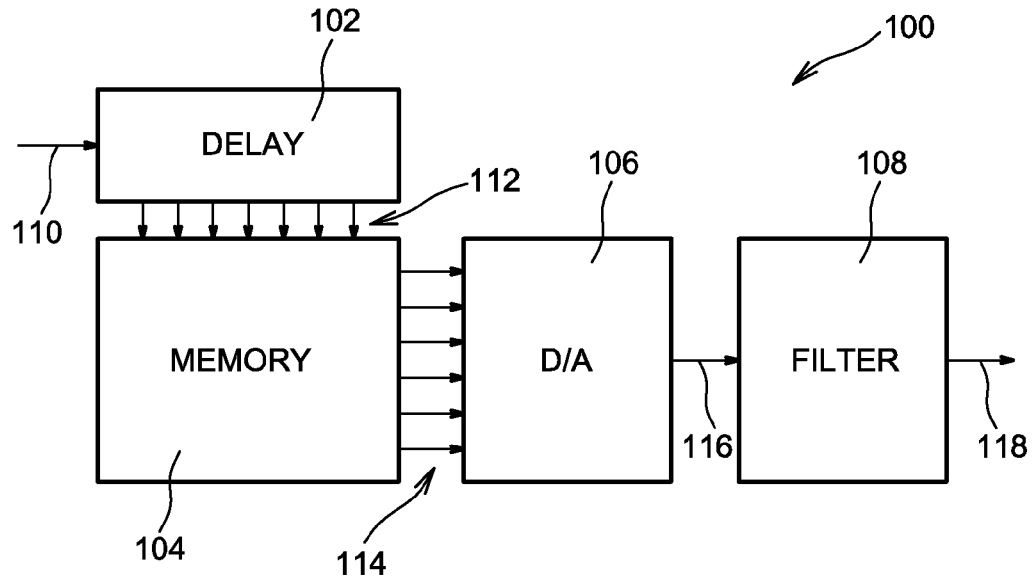

| | | | |
|---|---|---|---|
| 6,243,422 B1 * | 6/2001 | Urabe et al. | 375/259 |
| 6,603,818 B1 | 8/2003 | Dress, Jr. et al. | |
| 6,625,229 B2 | 9/2003 | Dress, Jr. et al. | |
| 6,735,238 B1 | 5/2004 | McCorkle | |
| 6,985,532 B2 | 1/2006 | Batra et al. | |
| 7,010,056 B1 | 3/2006 | McCorkle et al. | |
| 7,046,741 B2 * | 5/2006 | Brown et al. | 375/300 |
| 7,289,561 B2 | 10/2007 | Helal et al. | |

FOREIGN PATENT DOCUMENTS

| | | |
|---|---|---|
| GB | 2401016 A | 10/2004 |
| WO | 2004036810 A2 | 4/2004 |

OTHER PUBLICATIONS

Marchaland, David et al., "Novel Pulse Generator Architecture Dedicated to Low Data Rate UWB Systems", IEEE Wireless Technology 2005, the European Conference, 4 pages (Oct. 3 and 4, 2005).

Norimatsu, Takayasu et al., "A Novel UWB Impulse-Radio Transmitter With All-Digitally-Controlled Pulse Generator", Proceedings of ESSCIRC, Grenoble, France, pp. 267-270 (2005).

Smaini, Lydi et al., "Single-Chip CMOS Pulse Generator for UWB Systems", IEEE Journal of Solid-State Circuits, vol. 41, No. 7, pp. 1551-1561 (Jul. 2006).

Wentzloff, David D. et al., "Gaussian Pulse Generators for Sub-banded Ultra-Wideband Transmitters", IEEE Transactons on Microwave Theory and Techniques, vol. 54, No. 4, pp. 1647-1655 (Apr. 2006).

International Search Report, PCT/EP2008/052006, dated Mar. 6, 2008.

French Preliminary Search Report, FR 0753371, dated Oct. 22, 2007.

* cited by examiner

RADIO TRANSMITTER DEVICE

CROSS REFERENCE TO RELATED APPLICATIONS OR PRIORITY CLAIM

This application is a national phase of International Application No. PCT/EP2008/052006, entitled "RADIO TRANSMISSION DEVICE", which was filed on Feb. 19, 2008, and which claims priority of French Patent Application No. 07 53371, filed Feb. 20, 2007.

DESCRIPTION

Technical Field and Existing Technology

The invention relates to the field of data transmission, and in particular the transmission of short duration (a few nanosecond) pulses generated in order to act as a support for the transfer of information, for example at a frequency between about 1 GHz and 10 GHz, such as a pulse of the "Ultra-Wide Band" or UWB type, or transmission of data in accordance with the IEEE 802.15.4a standard.

A short duration pulse may be generated by modulation of a carrier frequency or constructed without having recourse to a carrier.

In the case of a pulse generated by the modulation of a carrier frequency, the transmitting device uses a periodic signal generator which forms a carrier with a frequency which is generally equal to the centre frequency of the desired spectrum. Modulation of this carrier is then carried out by a mixer which multiplies this carrier to an envelope signal. This envelope signal may itself be a pulse of diverse form whose length will characterise the spectral width of the resulting signal. A short duration pulse provides a wider spectrum than a pulse of longer duration. This modulation may also be carried out in quadrature as in a narrow band system.

The documents "Gaussian Pulse Generators for Sub-banded Ultra-Wideband Transmitters" by
D. Wentzloff et al., IEEE Transactions on Microwave Theory and Technics, Vol. 54, No. 4, April 2006, and "Novel Pulse Generator Architecture Dedicated to Low Data Rate UWB Systems" by D. Marchaland et al.,
IEEE Wireless Technology 2005, the European Conference, 3 and 4 Oct. 2005, describe such transmitter devices.

Generation of pulses by the modulation of a carrier frequency allows conventional radio blocks to be used, such as mixers, voltage controlled oscillators (VCOs), phase locked loops (PPLs), etc. In addition, by changing only the frequency of the carrier, the spectral band of the signal to be transmitted is easily shifted. The transmission power of the output signal may, in addition, be adjusted by the use of an envelope signal.

This technique of pulse generation requires however the use of PLL-type frequency synthesis which consumes power continuously. Furthermore, the presence of leaks of the carrier at the transmitter device output, that is, of interference transmissions of this carrier at the output of this transmitter device when no signal is intended to be transmitted causes problems for the removal of this carrier of the transmission spectrum. Finally, a wide-band power amplifier, which is difficult to construct, is usually required for the transmitter device.

Several solutions exist for obtaining a pulse which is not generated from a carrier. This type of pulse may be obtained, for example, by creating:

multiple derivatives of a step-signal, as described, for example, in documents U.S. Pat. No. 6,603,818 and U.S. Pat. No. 6,625,229.

combinations of several time-shifted delayed steps, as described for example in document EP 1,376,149.

the sum of single time-shifted delayed steps, as described for example in documents U.S. Pat. No. 7,010,056 and U.S. Pat. No. 6,735,238.

In general, these solutions are effective in terms of simplicity, of power consumed and spectrum width which may be very large. They may often not require a power amplifier and/or use simple amplifiers.

Transmitters which use this type of solution are however much less effective than carrier frequency modulation pulse generation transmitters as far as control of the pulse shape and its spectral response is concerned. For example, in order to offset the transmitter's spectral band, filtering of the constructed signal must be used, which also reduces the transmitted power. Finally, the transmitter power is also difficult to adjust with this type of generator.

Document U.S. Pat. No. 6,985,532 describes a pulse generator in which pulses are constructed from steps of different duration and/or amplitude added together at the output using control signals stored in a memory. This device uses a clock applied at the input to the pulse generator and which operates continuously, and which therefore represents a significant source of power consumption.

PRESENTATION OF THE INVENTION

One purpose of the present invention is to propose a low consumption transmitter device which allows pulses of variable form to be generated.

In order to achieve this, a transmitter device is proposed which includes at least:

one delay line designed to output M signals which are delayed in relation to each other, where M is a non-zero integer, a memory, designed to store at least M digital samples of a waveform, and to output as output each of the M digital samples respectively under the control of one of the M delayed signals, a digital-analog converter designed to carry out conversion of the M digital wave-form samples into an analog signal.

The present invention also concerns a transmitter device which includes at least:

one delay line designed to output M signals which are delayed in relation to each other, where M is an integer greater than 1, a memory, designed to store at least M digital samples of a waveform, where each digital sample comprises N bits, and to output each of the M digital samples successively over N output lines respectively under the control of one of the M delayed signals, a digital-analog converter which includes N inputs linked to N output lines, designed to convert the M digital samples received as input from the N output lines of the memory and to successively output, on an output of the digital-analog converter, each of the M analog converted digital samples which together form an analog signal which is representative of the waveform.

Thus the analog signal obtained may be a pulse which digitally codes an item of information in a transmission radio band.

With the invention a waveform of the pulses to be transmitted is digitally generated, which is of finite duration and which may be quantified, and it is rapidly analog converted without a clock signal. Generation of the digital waveform involves providing samples of the instantaneous waveform of the signal to be transmitted in real time. The invention is particularly advantageous when several digital samples are used, that is when M>1, in order to create the waveform. It is thus possible to obtain, almost instantaneously, a waveform created from numerous samples.

The delay line, which may be produced from logic circuits, controls a very fast memory in which there is no address decoding. This transmitter device does away with the need for a phasing clock to output digital samples, which may have a high frequency (for example about 10 GHz).

Reading of the memory at very high speed allows a digital data stream to be generated which is converted, in real time for example, by a digital-analog converter. The signal produced in this way is amplified so that it may be transmitted, for example to an antenna.

One practical advantage of this invention is the ability to easily vary the frequency of the digital wave-form thanks to the use of a delay line, since the frequency of the digital waveform is directly linked to the frequency of the delayed signals, that is, to the elementary delay of the delay line. An effect is therefore obtained which is equivalent to modifying the carrier frequency of a pulse generator in currently exiting technology. This advantage is particularly useful in the case of multi-band transmission systems for which the transmitter is capable of passing easily and quickly from one band of frequencies to another whilst retaining the form of the transmitted pulses.

Furthermore, from the design of the invention, no leakage of the carrier which leads to the transmission of a detrimental interference signal is possible at the transmitter device output. With the transmitter device according to the invention, when no signal is transmitted, the digital samples of the wave-form may have a zero value and the digital-analog converter, operating in an asynchronous manner, generates no interference signal.

In general terms, the transmitter device according to the invention operates in an asynchronous manner, which means that electricity consumption is reduced relative to transmitter devices using existing technologies which require a clock signal for their operation. The transmitter device according to the invention allows mean power consumptions to be achieved that are, for example, less than about 1 mW.

Relative to transmitter devices using existing technologies which involve wave generators without carriers, the transmitter device according to the invention possesses great flexibility and a great diversity in terms of the waveforms that may be generated, in as much as the memory of the transmitter device according to the invention may store several different waveforms and the content of the memory may be easily modified, allowing the waveform that is intended to be transmitted to be easily changed.

The delay line may include at least M delay cells connected to each other in series, where each delay cell is designed to apply a delay to a signal entering in this cell and to output said delayed input signal to the memory as one of the M delayed signals.

The delays applied by the delay cells between two consecutive signals among the M delayed signals may be approximately similar.

Each delay cell may include at least one control input, where the duration of the delay applied by each of the delay cells may depend on a control voltage or current applied to the control input of said delay cell.

The delay line may include at least one delay locked loop.

The M digital samples of the waveform may be sequentially stored in the memory, without addressing.

The memory may also include M AND logic gates designed to carry out an AND logic operation between one of the M delayed signals and another one of the M delayed signals, inverted, where these two delayed signals may be two consecutively emitted signals.

Each storage element may include at least two inverters looped to each other and at least two MOS transistors, where each MOS transistor is respectively linked to an input of one of the inverters, where the gates of the MOS transistors of N storage elements which are in a given column are connected to the output of one of the M AND logic gates of the memory.

Each storage element may include at least one flip-flop and an AND logic gate, where one input of each of said AND logic gates of the N storage elements in a given column is connected to the output of one of the M AND logic gates of the memory, another input of each of said AND logic gates being connected to the output of said flip-flop in the same storage element as said AND logic gate.

Each storage element may include at least one flip-flop and an AND logic gate, where one input of each of said AND logic gates of the N storage elements in a given column being designed to receive one of the M delayed signals, another input of each of said AND logic gates being connected to the output of said flip flop in same storage element as said AND logic gate.

The outputs of M AND logic gates of a line of M storage elements may be connected to at least M inputs of an OR logic gate and/or an exclusive OR logic gate.

The transmitter device may also include a second memory, in which are stored digital samples of a plurality of waveforms, connected to the other memory, where the transmitter device may be designed to transfer digital samples of at least one of the plurality of stored waveforms from the second memory into the other memory.

The memory may be designed to store the M digital samples of the waveform from a data file.

One of the N inputs of the digital-analog converter to which a n-th bit of the digital samples is intended to be outputted may be connected to a n-th amplifier which may include at least $2^n$ CMOS inverters connected in parallel.

The power of the signal transmitted by the transmitter device may be easily adjusted using the digital-analog converter.

The digital-analog converter may include at least N inputs, where N is the number of bits of one of the digital samples, where one input, to which a n-th amplitude bit of the digital samples is intended to be outputted, may be connected to at least two AND logic gates connected respectively to two n-th amplifiers created using $2^n$ CMOS inverters connected in parallel, where one input, to which a sign bit of the digital samples is intended to be outputted, may be connected to all said AND logic gates of the digital-analog converter.

One of the N inputs of the digital analog to which a n-th amplitude bit of the digital samples is intended to be outputted may be connected to at least two AND logic gates which may be respectively connected to two n-th amplifiers made using $2^n$ CMOS inverters connected in parallel, where one of the N inputs of the digital-analog converter to which a sign bit of the digital samples is intended to be outputted may be connected to all said AND logic gates of the digital-analog converter The digital-analog converter may further include capacitors designed to filter the analog signal.

The transmitter device may further include means for amplifying the analog signal obtained at the output of the digital-analog converter. These means for amplification may, for example, be a wide band power amplifier, which carries out amplification in the frequency band of the signal intended to be transmitted by the transmitter device.

The means for amplification may also carry out filtering of the analog signal obtained at the output of the digital-analog converter.

The transmitter device may also include at least one transformer, such as a balun type transformer, suitable for receiving the analog signal as an input.

The transmitter device may further include means for filtering the analog signal obtained at the output of the digital-analog converter or means for filtering the analog signal such that an output of the amplification means is connected to an input of the filtering means.

The analog signal may be a signal whose frequency is between about 1 GHz and 10 GHz, and/or may include at least one ultra wide band (UWB) pulse and/or may include at least one burst of pulses which comply with standard IEEE 802.15.4a.

With the transmitter device according to the invention, it is possible to generate "bursts" of pulses in accordance with the standard IEEE 802.15.4a, where the pulses in a burst are only separated from each other by 2 ns and in which overlapping results, in particular with pulses of the "root raised cosine" type.

A method for transmitting signals is also proposed which includes at least the steps of:

creating M signals which are delayed in relation to each other, where M is a non-zero integer, outputting M stored digital samples of a waveform, where each of the samples is outputted under the control of one of the M delayed signals.

analog conversion of the M digital samples of the waveform, where the analog signal obtained is an analog signal conforming to the waveform.

Each of the M delayed signals may include at least one step signal, and/or a rising or falling front and/or a clock signal.

The invention also relates to a method for transmitting signals which includes at least the steps of:

creating M signals which are delayed in relation to each other, where M is an integer greater than 1, outputting M stored digital samples of a waveform, where each of the samples includes N bits and is successively outputted on N output lines (114) respectively under the control of one of the M delayed signals (12.1 to 12.7), analog conversion of the M digital samples and successively outputting to an output of each of the M analogically converted digital samples which together form an analog signal which is representative of the waveform.

The M delayed signals may be obtained from a clock signal of period Tref, where an i-th signal from the M delayed signals includes the delayed clock signal with a delay approximately equal to $Td_i = i \times Td_0$, where $$Td_0 = \frac{Tref}{j},$$

j being a non-zero real number which defines the elementary delay $Td_0$ in relation to Tref.

The M stored digital samples may be outputted at the sampling frequency of the wave formed by the digital samples.

The transmission method may further include, after the analog conversion step, a filtering step and/or an amplification step.

BRIEF DESCRIPTION OF THE DIAGRAMS

Figure 2:
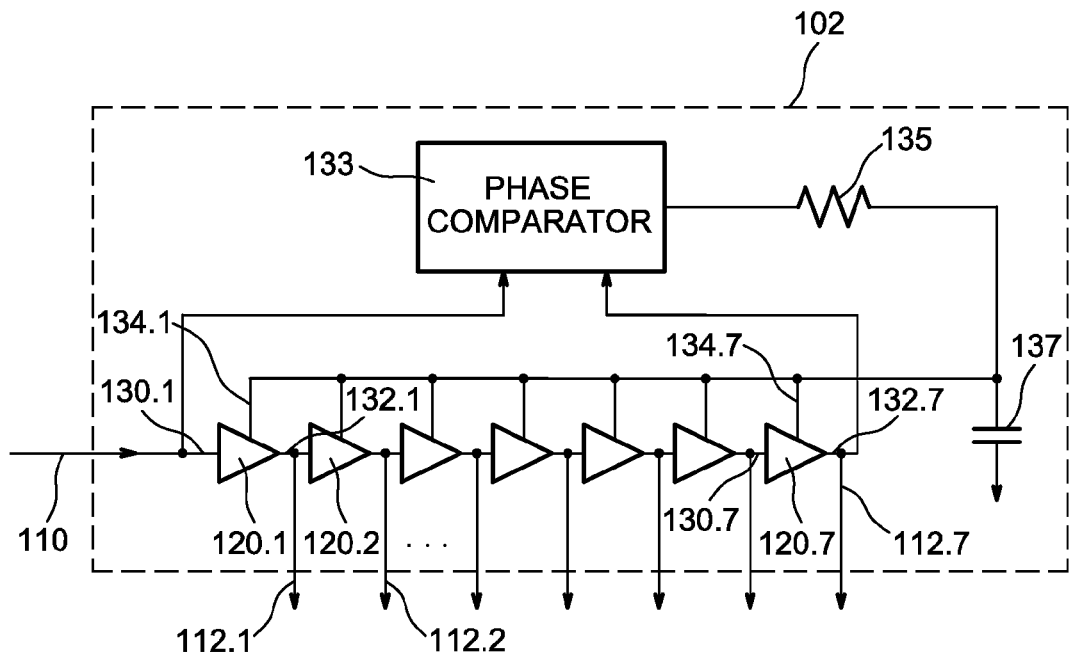
Figure 3A:
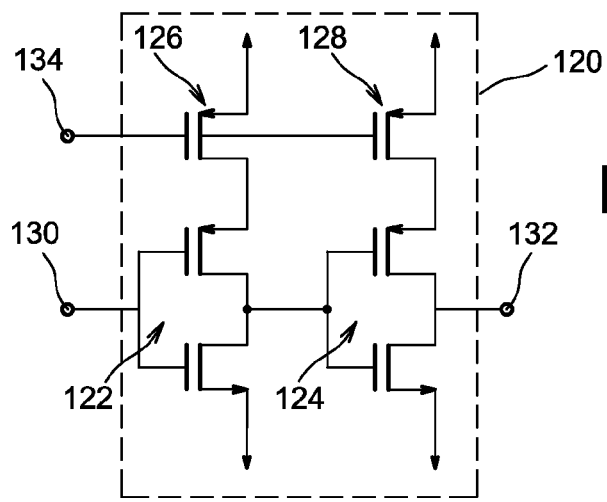
Figure 3B:
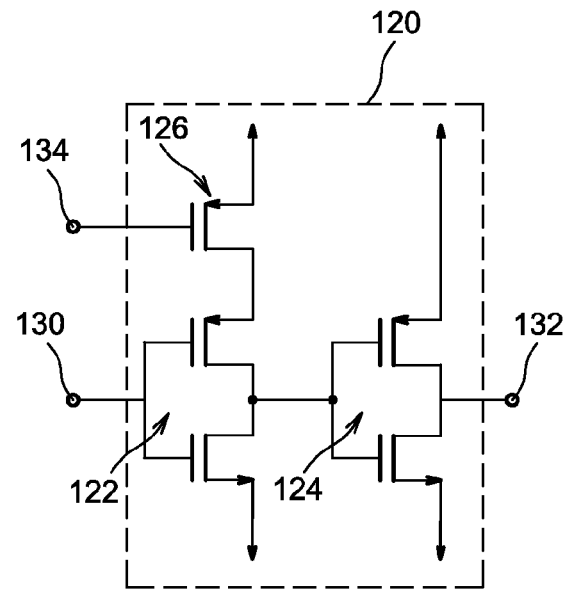
Figure 3C:
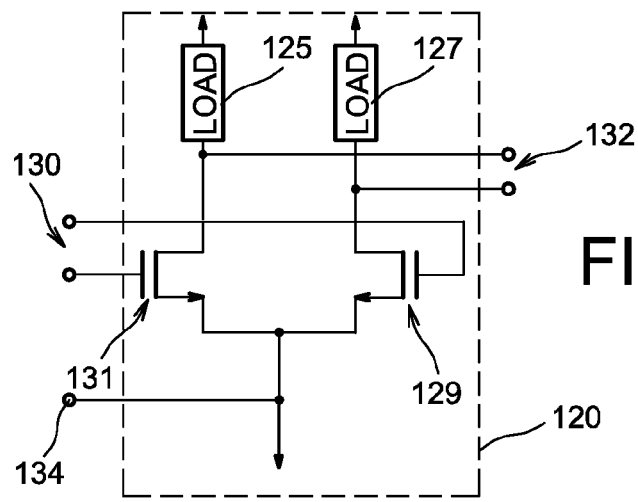
Figure 4:
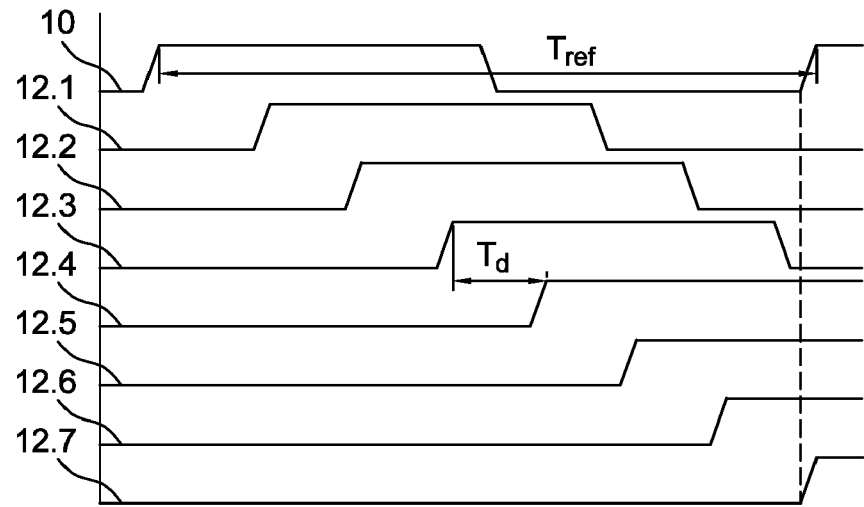
Figure 5:
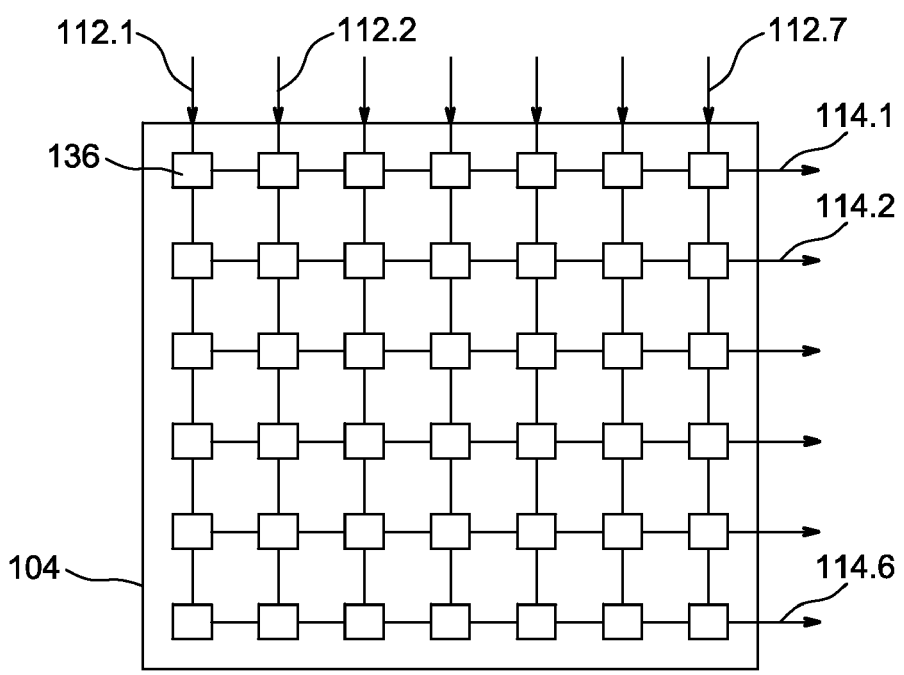
Figure 6:
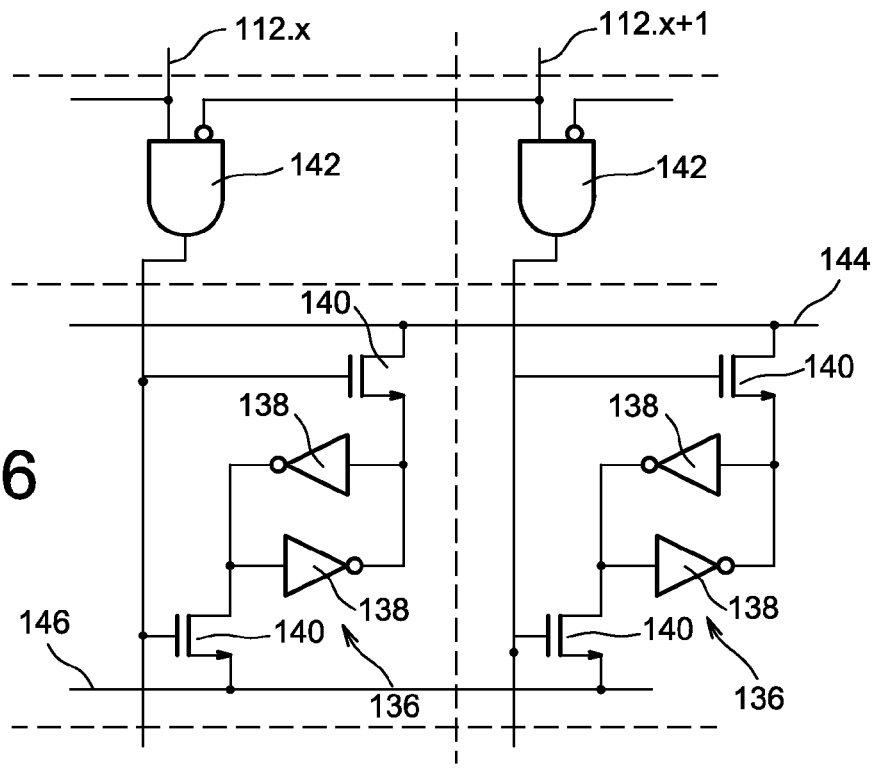
Figure 7:
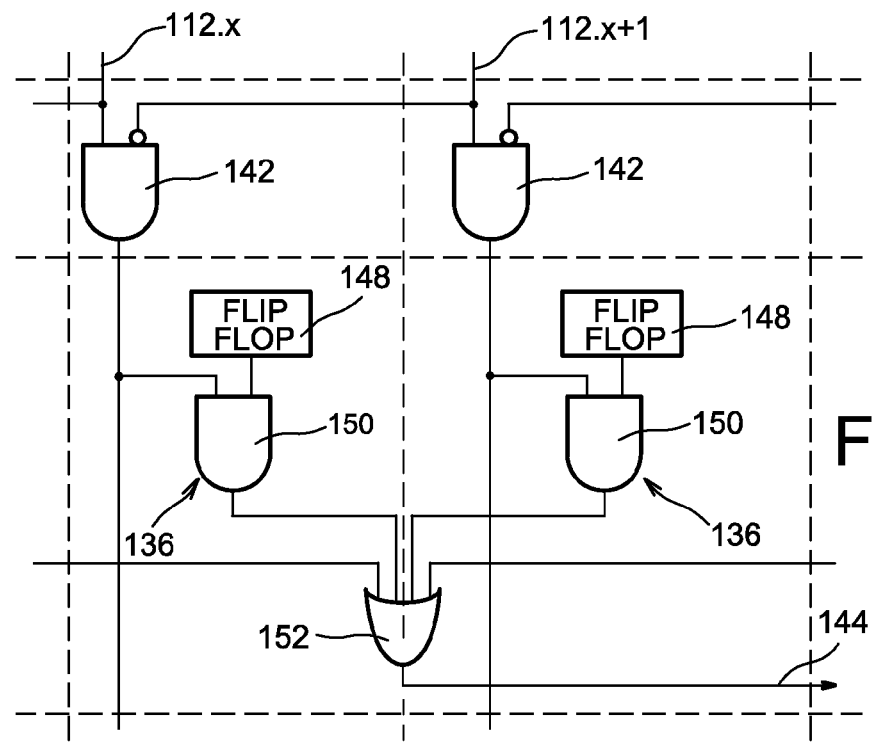
Figure 8:
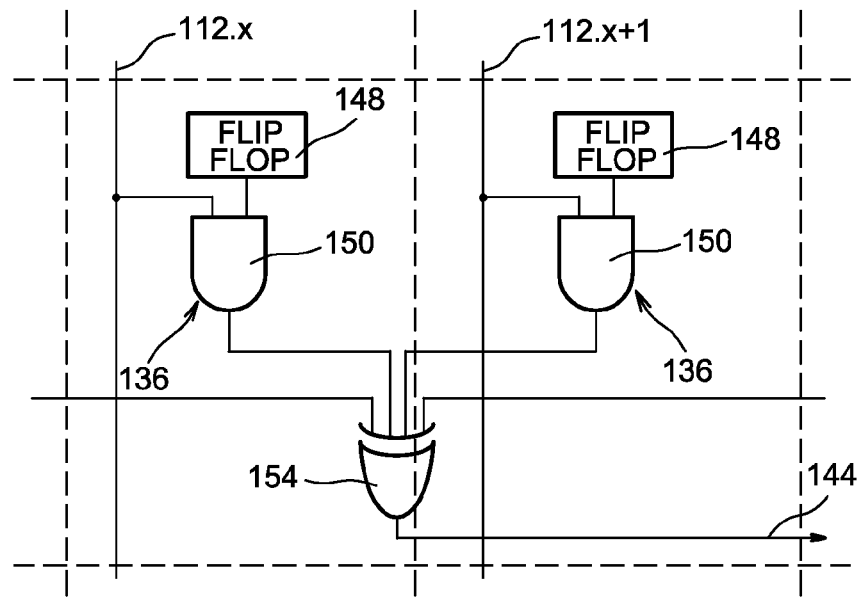
Figure 9:
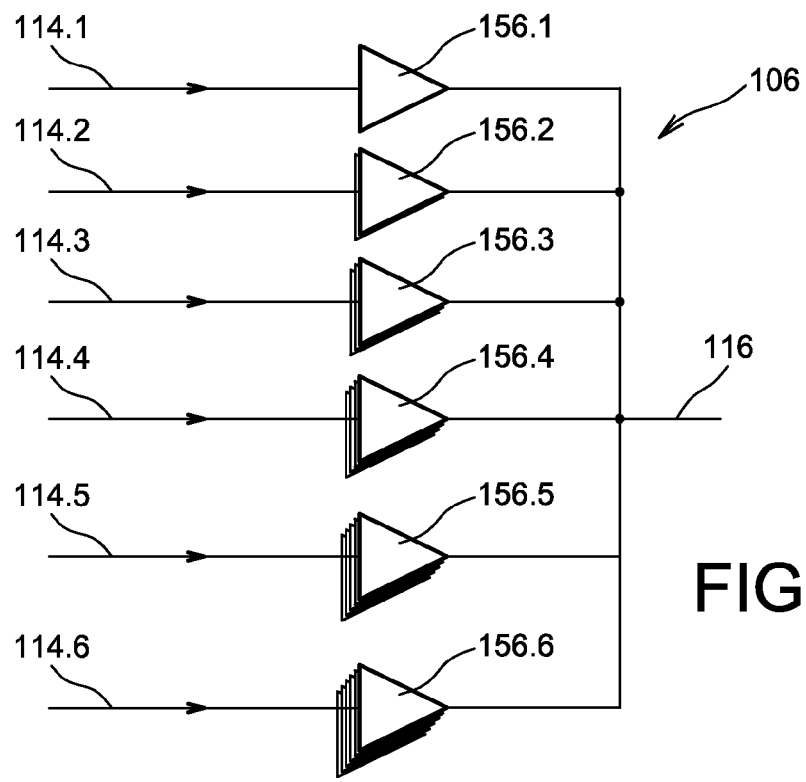
Figure 10:
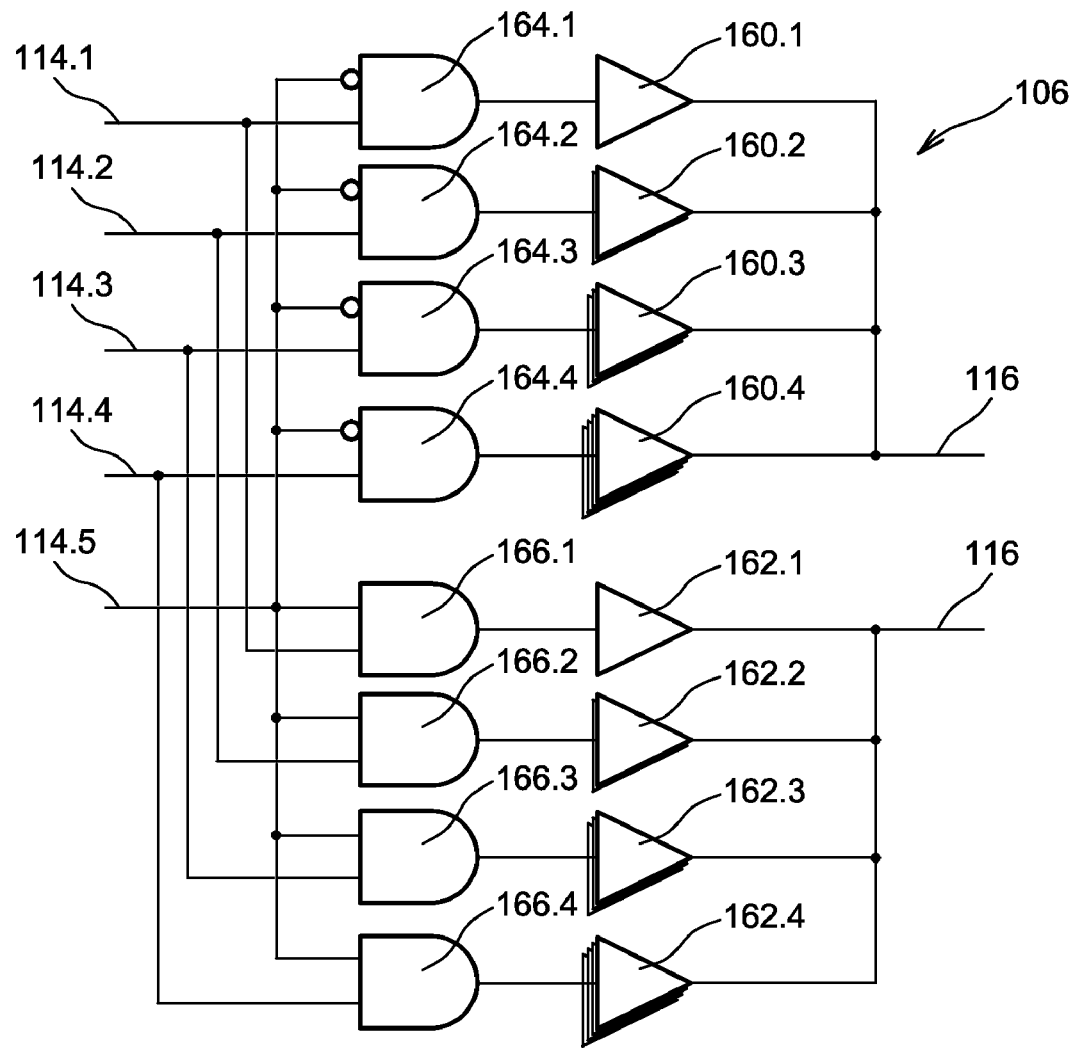
Figure 11:
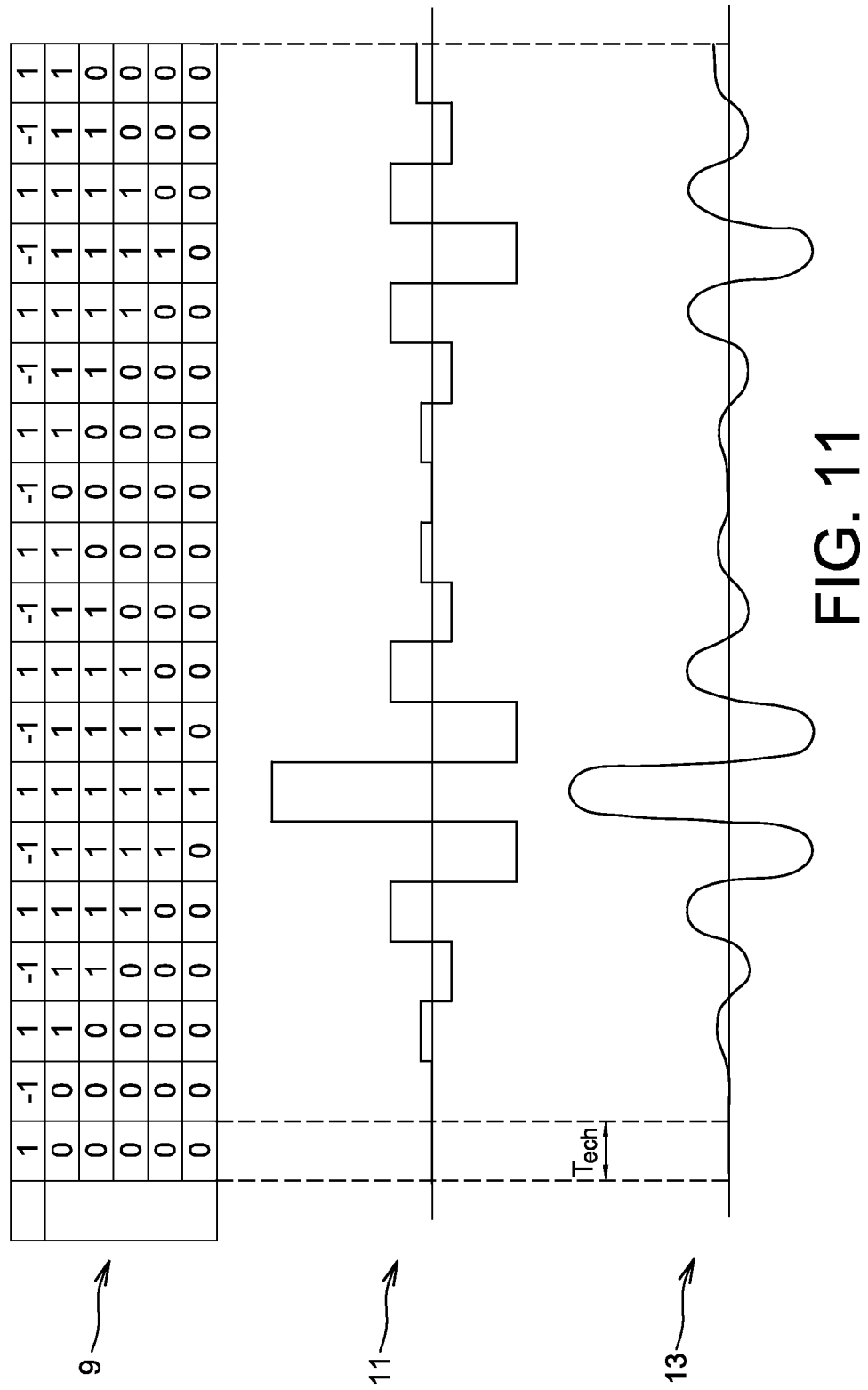

The present inventions will be better understood by reading the description of examples of embodiments, which are given for purely informative purposes and which are in no way limitative, whilst referring to the appended diagrams in which:

FIG. 1 shows a block diagram for a transmitter device which is the subject of the present invention, FIG. 2 shows a block diagram for a delay line of a transmitter device which is the subject of the present invention, FIGS. 3A to 3C show examples of the embodiment of a delay cell used in a delay line, FIG. 4 shows the propagation of a trigger signal in a delay line of a transmitter device which is the subject of the present invention, FIG. 5 shows a block diagram of a memory for a transmitter device which is the subject of the present invention, FIGS. 6 to 8 represent examples of the embodiment of two storage elements respectively from two successive columns x and x+1 of storage elements of a memory, FIGS. 9 and 10 show examples of the embodiment of a digital-analog converter of a transmitter device which is the subject of the present invention, FIG. 11 shows signals obtained at the outputs of the various elements of a transmitter device which is the subject of the present invention, during the transmission of a signal.

Figure 12:
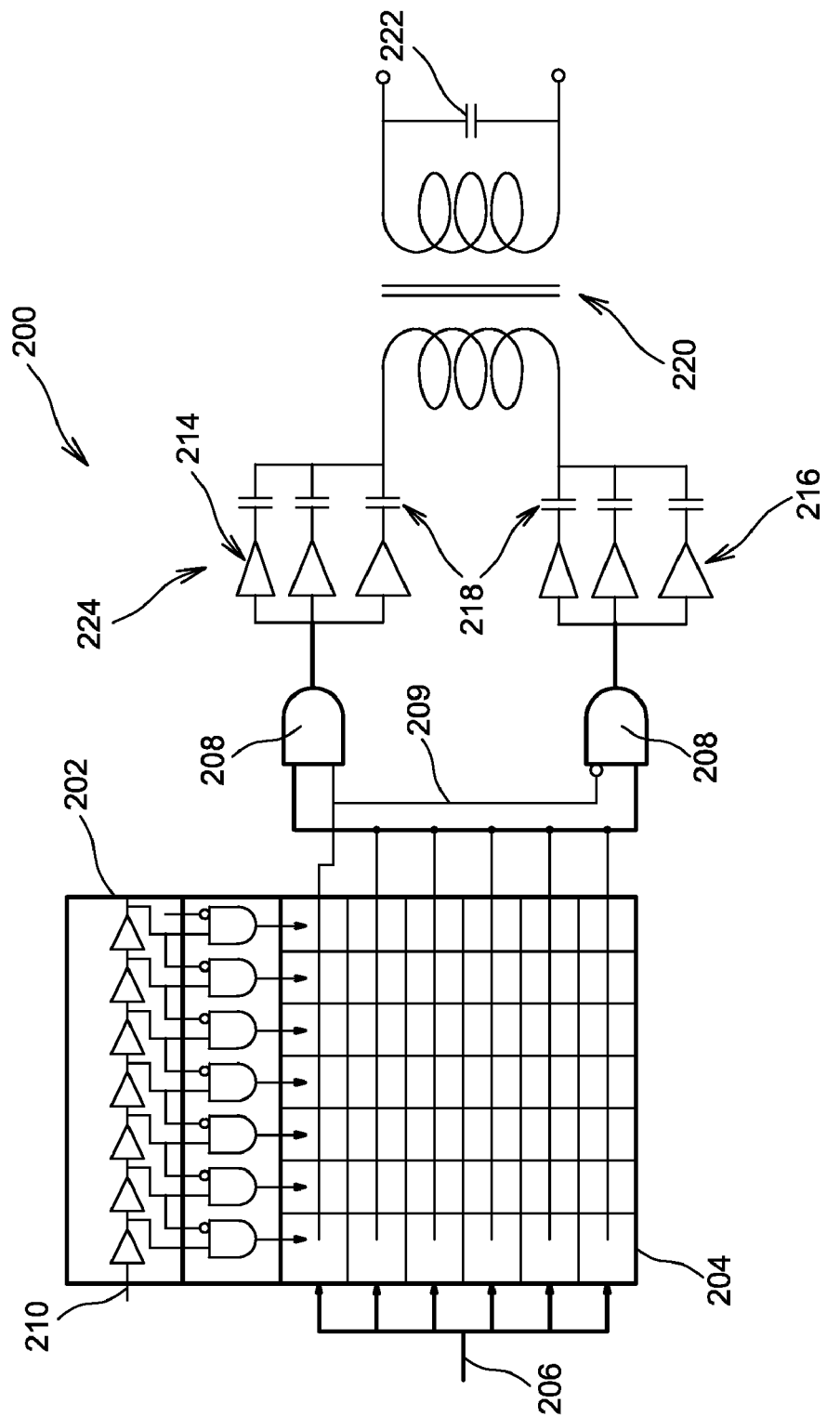
Figure 13:
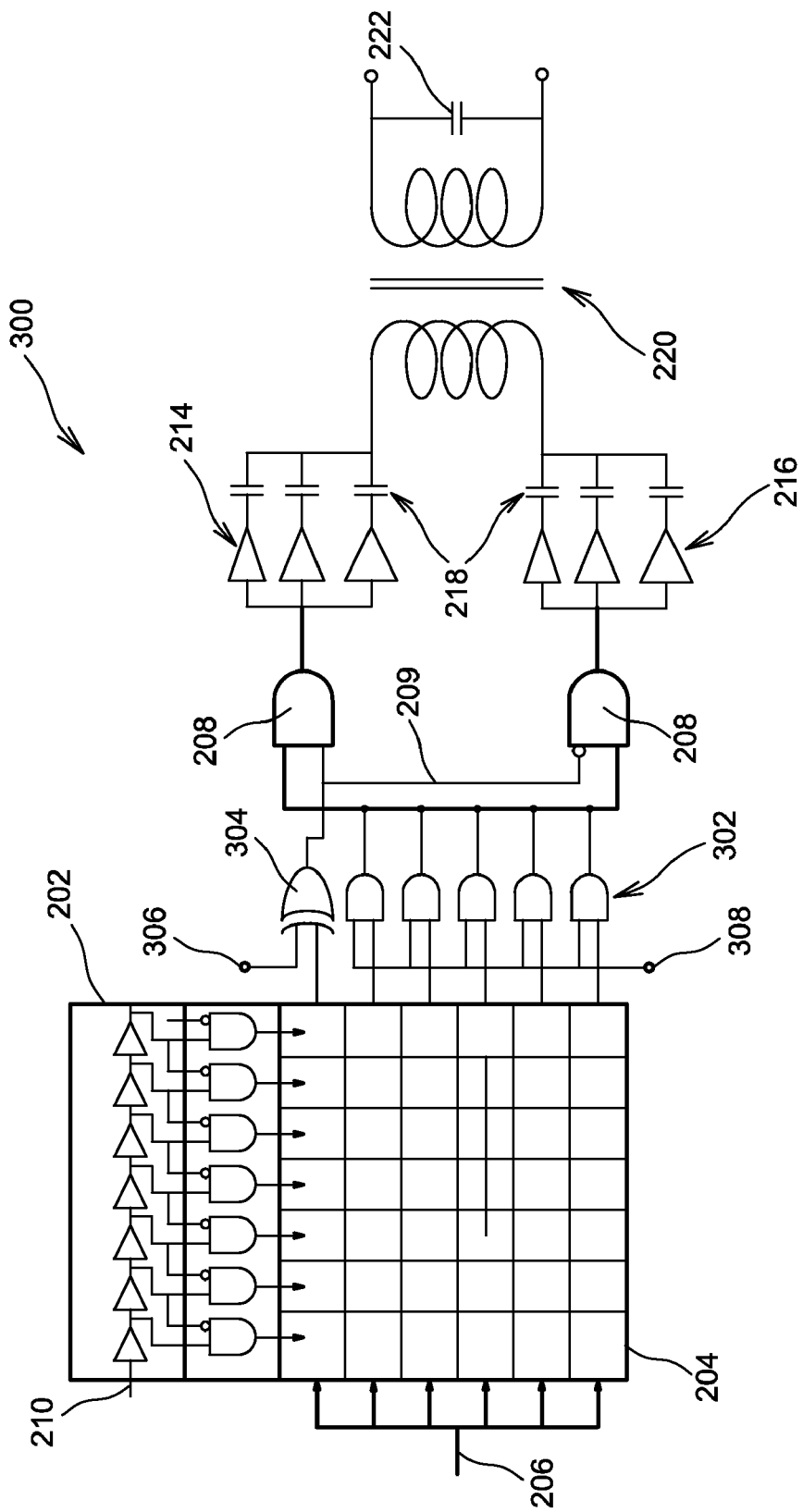

FIGS. 12 and 13 represent a transmission device which is the subject of the present invention, according to a first and second embodiments respectively.

Identical, similar or equivalent parts of the various figures described hereafter bear the same numerical references in order to facilitate moving from one figure to another.

In order to make the figures more readable, the various parts represented in the figures are not necessarily shown on a uniform scale.

The different possibilities (variants and embodiments) must be understood as not being exclusive of each other and may be combined together.

DETAILED DESCRIPTION OF SPECIFIC EMBODIMENTS

Reference should first be made to FIG. 1 which represents a block diagram for a transmitter device 100, here designed to transmit pulses, for example of the UWB type.

The transmitter 100 includes a delay line 102. This delay line 102, detailed in FIG. 2, here includes M elementary delay cells connected in series to each other, where M represents number of digital samples for the pulse to be transmitted. In FIG. 2, the delay line 102 includes seven delay cells 120.1 to 120.7. Outputs 132.1 to 132.7 of each delay cell 120.1 to 120.7 form outputs 112.1 to 112.7 of the delay line 102.

A trigger signal, in the form of a clock signal with a period Tref and which forms a step at each period of the clock signal, is applied to an input 110 of the delay line 102. This input 110 is connected to an input 130.1 of the first delay cell 120.1. The clock signal applied to the input 130.1 is propagated through the first cell 120.1 and is then outputted on the output 132.1 of the first cell 120.1, which is connected to the first output 112.1 of the delay line 102, with a delay Td which is less than the clock signal period Tref. The output 132.1 of the first cell 120.1 is also connected to an input to the second cell 120.2. The signal obtained at the output of the second cell 120.2, that is, also of the second output 112.2 of the delay line 102, is therefore delayed by the delay time Td applied by the first cell 120.1 plus the delay time Td applied by the second cell 120.2. The propagation time for the signal between the input and output of each delay cell 120.1 to 120.7, that is, the delay time Td for each of the cells, is dependent on a control voltage or current applied to the control inputs 134.1 to 134.7 of the cells

120.1 to 120.7. The example in FIG. 2 involves a control voltage. The delay times Td for each of the delay cells may be approximately all the same and such that Tref=M×Td. Thus, at each of the outputs 112.1 to 112.7 of the delay line 102 in FIG. 2, the clock signal applied to input 110 is obtained, delayed by a multiple of Td, such as, for example, Tref=7*Td. The i-th signal obtained at the output 112.*i* of the delay line 102 is therefore the clock signal applied to the input 110 delayed by a delay approximately equal to $Td_i=i \times Td_0$, where $$Td_0 = \frac{Tref}{j},$$

j is a real non-zero number which defines the elementary delay $Td_0$ relative to Tref.

The delay cells 120.1 to 120.7 may be constructed in several ways. FIGS. 3A to 3C each show examples of embodiments of a delay cell 120.

The cell 120 in FIG. 3A includes two MOS inverters 122 and 124 connected in series. The cell 120 also includes two MOS transistors, respectively 126 and 128, where each is connected to one of the MOS inverters, respectively 126 and 128, in order to partly limit the switching current of the inverters 122 and 124 as a function of a control voltage Vcom applied to the gates of transistors 126 and 128 through a control input 134. The signal applied to an input 130 of the cell 120 is therefore inverted twice by the inverters 126 and 128, with the signal obtained at the output 132 being of a similar value to the starting value, but delayed by the time required to carry out the two inversions.

Cell 120 in FIG. 3B also includes two MOS inverters 122 and 124, but only the MOS inverter 122 is connected to an MOS transistor 126. Therefore in cell 120 in FIG. 3B, only falling fronts of the signal propagated in the cell 120 are delayed, whereas in cell 120 in FIG. 3A, the rising and falling fronts of the signal propagated in cell 120 are delayed.

With the delay cell 120 in FIG. 3C the input and output signals of the cell 120 are differential. In this cell the delay time is dependent on a control current Icom continually applied to a control input 134 of the cell 120. The delay cell 120 in FIG. 3C includes two NMOS transistors 129 and 131, where the sources of these two NMOS transistors 129 and 131 are connected together and to the control input 134. Each terminal of the differential input 130 is connected respectively to a gate of one of the NMOS transistors 129 and 131. Each drain of the NMOS transistors 129 and 131 is respectively connected to a load 125 and 127, each containing at least one capacitor which carries out de-phasing filtering at the output, which is a function of the source current. The output 132 is taken in a differential manner between the drains of the NMOS transistors 129 and 131. The delay cell 120 in FIG. 3C has an operating speed which is greater than those in FIGS. 3A and 3B.

The delay line 102 represented in FIG. 2 also includes a feedback of DLL (Delay Locked Loop) type. The trigger signal, that is the reference clock of period Tref, is used to provide closed loop control of the elementary delays Td of cells 120.1 to 120.7 so that Tref=7×Td. This feedback, or closed loop control, is achieved using a phase comparator 133 used to measure the phase error which might be produced, with the latter then being filtered by a low-pass filter, formed, in FIG. 2 by a resistance 135 and a capacitor 137, or an integrator in order to generate the control voltage or current for the elementary delays.

FIG. 4 represents the propagation of the trigger signal in the delay line 102 in FIG. 2. A signal 10 represents the clock of period Tref applied to the input 110 of the delay line 102. The signals 12.1 to 12.7 respectively represent the signals obtained at the outputs 112.1 to 112.7 of the delay line 102. FIG. 4 shows that each of the signals 12.1 to 12.7 includes the clock signal applied to the input and successively delayed by an additional duration Td in relation to the previous signal. Given that Tref=M×Td, where M=7 (7 delay cells) in the case of the delay line 102 in FIG. 2, the signal 12.7 obtained for the last output 112.7 of the delay line 102 corresponds to the clock signal 10 delayed by a period equal to Tref, with a first rising front of the signal 12.7 being in phase with a second rising front of the clock signal 10.

The delay line 102 supplies as many delay signals as there are delay cells. The signals emerging from the delay line 102 may then possibly be combined together to create pulses of width Td rather than step signals.

The transmitter 100 also includes a memory 104 in which are stored the digital samples of the UWB pulse to be generated. In FIG. 1 it can be seen that the outputs 112 of the delay line 102 are applied as an input to the memory 104. The read frequency of the samples is equal to the sampling frequency of the pulse intended to be formed by the samples, for example about 10 GHz. This sample reading is carried out by the memory 104 without address decoding, with the reading speed then being greater than that of reading with address decoding. The samples are read sequentially in the memory 104, and not randomly.

FIG. 5 schematically shows the memory 104 of the transmitter 100. This memory 104 here contains M columns of N storage elements 136, where M represents the number of stored pulse samples used to represent this pulse as a function of time and where N represents the number of bits of one of the stored samples. In the example in FIG. 5, a pulse stored in the memory 104 is represented by M=7 samples each of N=6 bits. This memory 104 receives, as an input, the outputs 112.1 to 112.7 of the delay line 102. As soon as a clock signal is propagated over one of inputs 112.1 to 112.7, the column of storage elements 136 connected to this input outputs the 6 sample bits stored in said storage column elements 136 to N=6 output lines 114.1 to 114.6, with 1 bit on each output line 114.1 to 114.6.

Thus, in the embodiment of the transmitter 100 here described, a first clock signal, which corresponds, for example, to the signal 12.1 in FIG. 4, is propagated in the input 112.1. The six memory elements 136 of the column connected to this input 112.1 output the six bits of the first sample onto the outputs 114.1 to 114.6. Then, after a period equal to Td a second clock signal, which corresponds to the signal 12.2 in FIG. 4, is propagated in the input 112.2. The six memory elements 136 of the column connected to this input 112.2 output the six bits of the second sample to the outputs 114.1 to 114.6. The operation is repeated until a signal which corresponds to signal 12.7 in FIG. 4, is propagated in the last input 112.7, with the six memory elements 136 of the last column connected to this input 112.7 outputting the six bits of the seventh and last stored pulse sample. The operation is then repeated by starting again from the first column.

The stored pulse samples are therefore read over a period equal to Tref which corresponds to the period of the clock signal applied at the input to the delay line 102. The delay line 102 therefore directly controls the storage element columns 136 of the memory 104 in the direction going from column 112.1 to column 112.7.

In this embodiment, the memory 104 includes static storage elements 136. FIG. 6 shows an example of an embodiment of two storage elements 136 of two successive columns x and x+1 of the memory 104, where here 1≦x≦6. In the example in FIG. 6, each storage element 136 is formed of two inverters 138 looped together which are respectively read by means of two MOS transistors 140 connected respectively to one input of the inverters 138. These transistors 140 are controlled at their gates by a pulse formed on each column by an AND logic gate 142, which carries out, for example, for an AND logic gate 142 of the column x, the AND operation between the signal applied to an input 112.x of the column x and the inverted signal from the signal applied to an input 112.x+1 of the column x+1. In the embodiment here described, since the signals in FIG. 4 applied to the inputs 112.1 to 112.7 are all delayed by the same delay Td, the signal generated at the output of one of the M AND logic gates 142 is a pulse which starts on the rising front of the clock signal and is propagated on the corresponding input 112 and which terminates on the rising front of the clock signal which is propagated in the following column. Each of the outputs 114.1 to 114.6 of the memory 104 may be connected to a line 144 on which are outputted the bits read on one of the N lines of the memory 104 or on a line 146 on which is outputted the complementary signal of the bits read on one of the N lines of the memory 104.

In the example of the storage elements 136 in FIG. 6, each output 114 of the memory 104 is therefore permanently connected to M transistors, only one of which is passing (the one in reading mode). In order to increase the reading speed of the storage elements 136, the serial impedance of the transistors 140 is reduced.

FIG. 7 shows another example of an embodiment of storage elements 136 created without MOS transistors. Compared to the example of FIG. 6, the binary value of each storage element 136 is here stored in a flip-flop 148. Each storage element 136 includes an AND logic gate 150 which carries out a logical AND between the output signal from the logic AND gate 142 (which produces the pulse which controls reading of the value of the storage element) and the value stored in the flip-flop 148. At the output of this AND logic gate 150 the reading of the storage element is achieved (0 or 1 over a time period equal to Td). All the output signals of the AND logic gates 150 of a given line are led to an OR logic gate 152 which includes M inputs, which carries out, on the output line 144, the same logic operation as that obtained on logic line 144 of the example in FIG. 6. In this solution, since reading is achieved by means of logic gates, the signals are propagated faster than in a conventional memory. The propagation times are preferably the same throughout all storage elements 136, and the pulses of duration Td at the output of the AND logic gates 152 do not overlap.

FIG. 8 shows another embodiment of the storage elements 136. Compared to the examples of FIGS. 6 and 7, the memory 104 does not include AND gates 142 allowing read control pulses to be created from signals outputted by the delay line 102. The signals entering the memory 104 through the inputs, here 112.x and 112.x+1, are processed directly as inputs by the AND gates 150. In addition, the OR gate 152 in FIG. 7 has been replaced by an exclusive OR gate 154. The programming of samples therefore occurs here in a differential manner, with each data bit being coded in relation to the previous one (the value of the first implicitly being 0). In the samples stored in memory, a 0 indicates that the value does not change compared to the previous value and a 1 indicates that the value is inverted. The advantage of this solution is that only signals emitted from the delay line 102 are propagated.

There are therefore M digital samples of the pulse obtained at the output of the memory 104, intended to be emitted by the transmitter 100, coded over N bits.

These samples are then analog converted by the digital-analog converter 106.

FIG. 9 shows an example of an embodiment of the digital-analog converter 106. The first output 114.1 of the memory 104, on which the bit 0 of the digital pulse samples is outputted, is connected to the input of a first amplifier 156.1 formed by a CMOS inverter. The second output 114.2, on which bit 1 of the digital pulse samples is outputted, is connected to the input of a second amplifier 156.2 created using two CMOS inverters connected in parallel. In general terms, in this converter the output on which the n-th bit is outputted is connected to a n-th amplifier created using $2^n$ CMOS inverters connected in parallel. Thus the sixth and last output 114.6 represented in FIG. 9, on which bit 5 is outputted, is connected to $2^5=32$ CMOS inverters 156.6 connected in parallel. All the CMOS inverters of the converter 106 are identical here. The CMOS inverters arranged in parallel form equivalent amplifiers of greater or lesser size depending on the binary significance of each data bit. The inverters connected in parallel have an unchanged voltage output dynamic, whereas their output impedances Z are in parallel. Thus the impedance of the amplifier n is equal to $Z(n)=Z/2^n$. By connecting the outputs of all the amplifiers the sum Vs, weighted by an amplitude bit, of the voltages V(n) from each amplifier is obtained on an output 116 from the converter 106, to which all the outputs of the CMOS inverters of the converter 106 are connected, so that:

$$Vs = \frac{\frac{V(0)}{Z} + \frac{2V(1)}{Z} + \frac{4V(2)}{Z} + \ldots + \frac{2^N V(N)}{Z}}{\frac{1}{Z} + \frac{2}{Z} + \frac{4}{Z} + \ldots + \frac{2^N}{Z}}$$

that is:

$$Vs = \frac{1}{2^N - 1} \sum_{n=0}^{N} 2^n \cdot V(n).$$

Where N is the number of bits of one of the M digital samples and V(n) the voltage equal to 0 or 1 depending on the value of the n-th bit of a digital sample applied to the input of the amplifier n.

With this converter 106, unless its supply is symmetrical, for example between two voltages of opposite sign, the output voltage is always of the same sign. If one of the bits which code the pulse is a sign bit, this will be the most significant and Vs will then exhibit a bias which is equal to about half the supply voltage depending on this sign.

FIG. 10 shows a second example of an embodiment of the digital-analog converter 106, where in this case the pulse is coded using a sign bit with no particular coding, and the output Vs being differential. In this second example, the value of the pulse is here considered to be coded over 5 data bits, with 1 sign bit (emitted over output 114.5). This converter 106 according to this second embodiment could however also be used for a digital-analog conversion of a pulse coded by a number of bits greater than 5. The converter 106 in this second embodiment includes four first inverters 160.1 to 160.4 created using CMOS amplifiers, for example similar to the amplifiers 156.1 to 156.4 in FIG. 9, as well as four second amplifiers 162.1 to 162.4, for example similar to the first amplifiers 160.1 to 160.4.

In the example in FIG. 10, the first amplifiers 160.1 to 160.4 are used for analog conversion of the pulse when it has, for example, a positive sign, where the second amplifiers 162.1 to 162.4 are used for analog conversion of the pulse when it has, for example, a negative sign.

Each of the inputs of the first amplifiers 160.1 to 160.4 is connected to the output of an AND logic gate 164.1 to 164.4. Similarly each of the inputs of the second amplifiers 162.1 to 162.4 is connected to the output of an AND logic gate 166.1 to 166.4. These AND logic gates 164.1 to 164.4 and 166.1 to 166.4 are used to force the output of the amplifiers used for one of the two polarities to zero, depending on the sign bit of the pulse.

The analog converted signal is obtained differentially at the output 116. The signal Vs obtained at the output of the converter 106 according to this second embodiment is equal to:

$$Vs = \frac{2 \cdot S}{2^{N-1} - 1} \sum_{n=0}^{N-1} 2^n \cdot V(n)$$

where S is the sign bit which may take one of the values −1 or +1, and N the number of bits onto which the pulse is digitally encoded (N−1 amplitude bits and 1 sign bit).

This digital-analog converter 106 according to this second embodiment is used to obtain a signed output signal with no bias with an asymmetric supply, and of amplitude which is double compared to the digital-analog converter 106 of the first embodiment shown in FIG. 9.

Another example of a digital-analog converter which uses the sum of switched currents is also described in document U.S. Pat. No. 6,985,532.

Any digital-analog converter may be suitable for the invention if it can supply an output signal in the radio band and in particular from 1 to 10 GHz. The converter used here does not need a clock for its operation.

If the converter does not supply the necessary transmission power, an amplifier, for example of wide band type, may be inserted at the output of the converter, together with a filter to remove from the analog signal the harmonics generated by the converter.

In the example of the transmitter device 100 in FIG. 1, the output 116 of the digital-analog converter 106 is connected to the input of a filter 108.

The signal obtained at the output of the digital-analog converter 106 remains sampled and between two samples exhibits undesirable sudden transitions. These transitions are located at frequencies which are greater than the frequencies of the desired signal band. Their elimination and the smoothing out of the signal may be achieved by making use of the use of interference filtering of the converter 106 and of the output 116, or by the filter 108 which may be a low-pass filter or band-pass filter, therefore cutting off as much of the high frequencies as possible whilst preserving the spectrum of the signal to be transmitted.

If a power amplifier is used before the signal transmission, the latter could be selected so as to naturally filter the useable signal band, thus forming the filter 108.

FIG. 11 shows the various steps in the <<construction>> of the signal to be transmitted, that is, the signals obtained at various parts of the transmitter device 100. Each column of the table 9 shows a binary value of each pulse sample obtained at the output of the memory 104. The first line of the table 9 represents the sign of the signal. Curve 11 is the signal obtained at the output of the digital-analog converter 106. Curve 13 represents the signal obtained at the output of the filter 108. Here Tech represents the pulse sampling period. In the case of ultra-wide band, the sampling period Tech may be of the order of 100 ps. The sign bit is optional and may be omitted for example if the signal to be generated is always of the same sign.

Sampling theories show that the generation of the digital waveform is carried out at least twice the frequency of the signal that has to be generated. For example, if it is desired to transmit a signal whose frequency is equal to 4 GHz, the sampling is intended to be carried out at least 8 Ge/sec (samples per second). The digital-analog conversion is, for its part, capable of supplying analog samples at the same rate.

The transmitter device also includes a transmitter antenna, which is not shown in FIG. 1, here connected to the output 118 of the filter 108, used to transmit the generated waveform. It is also possible for the antenna to be connected to the output 116 of the digital-analog converter 106 when the transmitter device 100 includes no filter 108.

FIG. 12 shows a transmitter device 200 according to a first embodiment. A trigger signal is applied to an input 210 of a logic delay line 202. The delay line 202 is used to generate step signals with as many elementary delays Td as there are element storage columns in a memory 204. AND logic gates associated with each delay cell in the delay line 202 uses the steps to construct a square pulse whose width corresponds to a delay Td and which is propagated from one cell to another at an interval of Td. It should be noted that the delay line 202 may be looped so that it causes Td to vary and undergo closed-loop control by a reference clock and thus form a "delay locked loop" (DLL). Td also represents the equivalent time step for the samples. The low electrical power consumption of a delay line, whether looped or not, is an advantage compared to, for example, a PLL.

The pulse waveform to be generated is loaded into the memory 204 using inputs 206 before the trigger signal is propagated in the delay line 202. The selection of data stored in the memory 204 which represents the waveform is not achieved by addressing but in columns, through an AND gate located in each memory cell in the memory 204. This AND logic is achieved between pulses emerging from the delay line 204 and the bits of the waveform stored in the memory 204. The result is a pulse when the stored bit has a logic level of "1" and is nothing when the stored bit has a logic level of "0". Using an OR operation between all the memory cells in a line of the memory 204, the memory 204 supplies each output line with a bit of the digital signal generated. In other terms, each bit is formed from the sum of pulses emerging from the delay line modulated by the waveform pattern stored in the memory line for this bit. For example, if the pattern <<010101 . . . >> is loaded in the memory, the result will be a clock-type signal with a period of 2.Td.

This transmitter device 200 can potentially repeat the same waveform for each trigger signal applied to the input 210. If the time between two transmissions allows it, however, the memory 204 may be reloaded with a new waveform, stored, for example, in another memory linked to the inputs 206 of the memory 204, not shown in FIG. 12, for the following pulse. Thus different waveforms may be transmitted for several trigger signals applied to the input 210. In addition, the memory 204 may also include a number of storage elements so that it is possible to store several waveforms in this memory 204.

In this example in FIG. 12, the digital signal includes N−1 amplitude bits and one sign bit, but it may be coded in various ways which lead to different types of digital-analog converters and in particular to converters which may or may not be differential. In the case of a differential digital-analog converter, the digital signal obtained at the output of the memory 204 is separated into two signals which are in phase opposition. In the example of the transmitter device 200 in FIG. 12, the amplitude bits are selected by 2(N−1) AND gates 208 depending on the value of the sign bit propagated on a line 209. In FIG. 12, only two AND gates 208 are shown. The bits emerging from the memory 204 are thus alternately supplied to power amplifiers of one polarity 214 or the other 216 depending on the value of the sign bit, where these amplifiers 214 and 216 here form a differential digital-analog converter 224. It is also possible to use a non-differential digital-analog converter (with a single set of amplifiers, for example) to which a signal would be presented on bits using the current sign bit as the most significant bit.

In the example in FIG. 12, the differential digital-analog converter is based on the weighted sum in powers of two of the current provided by as many amplifiers as there are amplitude bits. The amplifiers may here be logic inverters of sufficient size for the power to be supplied. CMOS inverters, for example, have the advantage of only consuming low leak currents in the absence of transition on the signals. Capacitors 218 are connected to the outputs of amplifiers 214 and 216, providing filtering of the signal obtained at the output of the amplifiers 214 and 216.

The output of the digital-analog converter 224 is connected to a transformer 220, for example of the balun type, so as to convert differential currents obtained at the output of the digital-analog converter 224 into a voltage output signal, which could be referenced to earth (non-differential signal), and which is then filtered by a capacitor 222. In the absence of the transformer 220, the signal would here be of the differential type and referenced to half the supply voltage of the amplifiers In this example of a transmitter device 200, this does not make use of a sampling clock and the digital-analog converter 224 of this transmitter 200 requires no clock.

FIG. 13 shows a transmitter device 300 according to a second embodiment. Compared to the transmitter device 200 in FIG. 12, the transmitter device 300 includes AND logic gates 302 linked to the outputs of the memory 204 to which are supplied the amplitude bits of the pulse, together with an exclusive OR gate 304 connected to the output of the memory 204 on which the pulse sign bit is outputted. Thus it is possible to polarity modulate the pulse, for example using BPSK (Binary Phase Shift Keying) or DBPSK (Differential Binary Phase Shift Keying) modulation, over the entire waveform, from a polarity signal applied to an input 306 of the exclusive OR gate 304. The AND gates 302 are used to activate and deactivate generation of pulses by means of an activation signal applied to an input 308 on each of the AND gates, without having to load a null waveform into the memory 204 and without blocking the trigger signal of the delay line 202 applied to the input 210 when no pulse has to be generated. An OOK (On Off Shift Keying) modulation may also be carried out.

This transmitter device 300 allows pulse generation to be simplified, in particular by avoiding having to load waveforms into the memory 204 when all that is involved is the generation of an opposite wave-form or a null wave-form.

It is also possible to use a trigger signal for the delay line 202 which is a clock, and thus transform the delay line 202 into a delay locked loop (DLL).

The transmitter device according to the invention may be constructed for example using integrated components on a silicon circuit.

The invention may be used in all applications which relate to short range wireless communications (several tens of metres) of the UWB type. It may advantageously replace existing transmitters and it is compatible with the IEEE 802.15.4a standard which requires the transmission of bursts of pulses.

The invention also has numerous applications in the field of remote measurement, location or in measurements of the speed of motion of a transmitter-receiver. The low power consumption properties mean that portable device powered by batteries may be constructed. The applications may therefore be very varied in fields such as telemetry or the monitoring of the movements of individuals and goods in buildings or transport.

The invention claimed is:

1. A transmitter device which includes at least:
   one delay line designed to output M signals which are delayed in relation to each other, where M is an integer greater than 1,
   a memory, designed to store at least M digital samples of a wave-form, where each digital sample comprises N bits, and to output each of the M digital samples successively over N output lines respectively, under the control of one of the M delayed signals,
   a digital-analog converter which includes N inputs linked to N output lines, designed to convert the M digital samples received as input from the N output lines of the memory and to successively output, on an output of the digital-analog converter each of the M analog converted digital samples which together form an analog signal which is representative of the waveform.

2. The transmitter device according to claim 1, the delay line including at least M delay cells connected to each other in series, each delay cell being designed to apply a delay to a signal entering in this cell and to output said delayed input signal to the memory as one of the M delayed signals.

3. The transmitter device according to claim 2, the delays applied by the delay cells between two consecutive signals among the M delayed signals being approximately similar.

4. The transmitter device according to claim 2, each delay cell including at least one control input, the duration of the delay applied by each of the delay cells depending on a control voltage or current applied to the control input of said delay cell.

5. The transmitter device according to claim 4, each delay cell further including two MOS inverters connected in series and at least one MOS transistor connected to one of the MOS inverters, the control input of each delay cell being connected to a fate of the MOS transistor of this delay cell.

6. The transmitter device according to claim 5, each delay cell further including a second MOS transistor connected to the other of the MOS inverters, the control input of each delay cell being connected to a gate of the second MOS transistor of this delay cell.

7. The transmitter device according to claim 2, each delay cell including at least two NMOS transistors, one drain of each NMOS transistor being connected to a resistor, the input of each delay cell being applied in a differential manner between the gates of the NMOS transistors and the output of each delay cell being taken in a differential manner between the drains of the NMOS transistors.

8. The transmitter device according to claim 1, the delay line including at least one delay locked loop.

9. The transmitter device according to claim 8, the delay locked loop including at least one phase comparator and a low-pass filter.

10. The transmitter device according to claim 1, the M digital samples of the waveform being stored sequentially in the memory without addressing.

11. The transmitter device according to claim 1, the memory including at least M columns of N storage elements, also forming N lines of M storage elements.

12. The transmitter device according to claim 11, the memory further including M AND logic gates designed to carry out an AND logic operation between one of the M delayed signals and another one of the M delayed signals which is inverted.

13. The transmitter device according to claim 12, each storage element including at least two inverters looped to each other and at least two MOS transistors, each MOS transistor being respectively linked to an input of one of the inverters, the gates of the MOS transistors of N storage elements which are in a given column being connected to the output of one of the M AND logic gates of the memory.

14. The transmitter device according to claim 12, each storage element including at least one flip-flop and an AND logic gate, one input of each of said AND logic gates of the N storage elements in a given column being connected to the output of one of the M AND logic gates of the memory, another input of each of said AND logic gates being connected to the output of said flip-flop which is in the same storage element as said AND logic gate.

15. The transmitter device according to claim 11, each storage element including at least one flip-flop and an AND logic gate, one input of each of said AND logic gates of the N storage elements in a given column being designed to receive one of the M delayed signals, another input of each of said AND logic gates being connected to the output of said flip-flop in the same storage element as said AND logic gate.

16. The transmitter device according to claim 14, the outputs of M AND logic gates of a line of M storage elements being connected to at least M inputs of an OR logic gate and/or an exclusive OR logic gate.

17. The transmitter device according to claim 1, which also includes a second memory, in which are stored digital samples of a plurality of waveforms, connected to the other memory, the transmitter device being designed to transfer digital samples of at least one of the plurality of stored waveforms from the second memory into the other memory.

18. The transmitter device according to claim 1, the memory being designed to store the M digital samples of the waveform from a data file.

19. The transmitter device according to claim 1, one of the N inputs of the digital-analog converter, to which a n-th bit of the digital samples is intended to be outputted, being connected to a n-th amplifier which includes at least $2^n$ CMOS inverters connected in parallel.

20. The transmitter device according to claim 1, the digital-analog converter carrying out a conversion operation in accordance with the equation:

$$Vs = \frac{1}{2^N - 1} \sum_{n=0}^{N} 2^n \cdot V(n),$$

where
Vs: analog signal voltage obtained at the output of the converter,
V(n): voltage of a n-th bit of one of the M digital samples.

21. The transmitter device according to claim 1, one of the N inputs of the digital-analog converter, to which a n-th amplitude bit of the digital samples is intended to be outputted, being connected to at least two AND logic gates respectively connected to two n-th amplifiers made using $2^n$ CMOS inverters connected in parallel, one of the N inputs of the digital-analog converter, to which a sign bit of the digital samples is intended to be outputted, being connected to all said AND logic gates of the digital-analog converter.

22. The transmitter device according to claim 1, the digital-analog converter carrying out a conversion operation in accordance with the equation:

$$Vs = \frac{2 \cdot S}{2^{N-1} - 1} \sum_{n=0}^{N-1} 2^n \cdot V(n),$$

where
Vs: analog signal voltage obtained at the output of the converter;
S: sign bit of the digital samples which may take one of the values −1 or +1;
V(n): voltage of a n-th bit of one of the M digital samples;
N: number of bits of one of the M digital samples (N−1 amplitude bits+1 sign bit).

23. The transmitter device according to claim 1, the digital-analog converter further including capacitors designed to filter the analog signal.

24. The transmitter device according to claim 1, further including a plurality of AND logic gates connected to the outputs of the memory to which the N−1 amplitude bits of the M digital samples are supplied, and an exclusive OR gate connected to the output of the memory to which the sign bit of the M digital samples is outputted, the outputs of said AND logic gates and of said exclusive OR gate being connected to the digital-analog converter.

25. The transmitter device according to claim 1, further including at least one transformer, such as a balun type transformer, suitable for receiving the analog signal as an input.

26. The transmitter device according to claim 1, further including means for amplifying the analog signal obtained at the output of the digital-analog converter.

27. The transmitter device according claim 26, the means for amplifying also carrying out filtering of the analog signal obtained at the output of the digital-analog converter.

28. The transmitter device according to claim 1, further including means for filtering the analog signal obtained at the output of the digital-analog converter.

29. The transmitter device according to claim 26, further including means for filtering the analog signal, an output of the amplification means being connected to an input of the filtering means.

30. The transmitter device according to claim 28, the filtering means including at least one low-pass filter and/or at least one band-pass filter.

31. The transmitter device according to claim 1, the analog signal being a signal whose frequency is between about 1 GHz and 10 GHz.

32. The transmitter device according to claim 1, the analog signal including at least one ultra-wide band (UWB) pulse.

33. The transmitter device according to claim 1, the analog signal including at least one burst of pulses in accordance with the IEEE 802.15.4a standard.

34. A method for transmitting signals which includes at least the steps of:
- creating M signals which are delayed in relation to each other, where M is a non-zero integer,
- outputting M stored digital samples of N bits of a waveform, where each of the samples is successively outputted on N output lines respectively under the control of one of the M delayed signals,
- analog conversion of the M digital samples and successively outputting to an output of each of the M analog converted digital samples which together form an analog signal which is representative of the waveform.

35. The transmission method according to claim 34, each of the M delayed signals including at least one step signal, and/or a rising or falling front, and/or a clock signal.

36. The transmission method according to claim 34, the delays between two consecutive signals among the M delayed signals being approximately similar.

37. The transmission method according to claim 36, the M delayed signals being obtained from a clock signal of period Tref, an i-th signal from the M delayed signals including the delayed clock signal with a delay approximately equal to $Td_i = i \times Td_0$, where $$Td_0 = \frac{Tref}{j},$$

being a non-zero real number which defines the elementary delay $Td_0$ in relation to Tref.

38. The transmission method according to claim 37, delays of the M delayed signals being adjusted by a control voltage or current obtained by measuring a phase error of the clock signal.

39. The transmission method according to claim 34, the M stored digital samples being outputted at the sampling frequency of the wave formed by the digital samples.

40. The transmission method according to claim 34, the analog conversion of the M digital samples being carried out in accordance with the equation:

$$Vs = \frac{1}{2^N - 1} \sum_{n=0}^{N} 2^n \cdot V(n),$$

where
- Vs: voltage of the analog signal obtained,
- V(n): voltage of a n-th bit of one of the M digital samples.

41. The transmission method according to claim 34, the analog conversion of the M digital samples being carried out in accordance with the equation:

$$Vs = \frac{2 \cdot S}{2^{N-1} - 1} \sum_{n=0}^{N-1} 2^n \cdot V(n),$$

where
- S: sign bit of the digital samples which may take one of the values −1 or +1,
- Vs: voltage of the analog signal obtained,
- V(n): voltage of a n-th bit of one of the M digital samples,
- N: number of bits of one of the M digital samples (N−1 amplitude bits+1 sign bit).

42. The transmission method according to claim 34, further including, after the analog conversion step, a filtering step and/or an amplification step.

43. The transmission method according to claim 34, further including, after the step in which M stored digital samples are outputted, a step for polarity modulation of the M digital samples, such as BPSK and/or DBPSK and/or OOK modulation.

* * * * *